(12) United States Patent  
Michel et al.

(10) Patent No.: US 8,327,540 B2  
(45) Date of Patent: Dec. 11, 2012

(54) PATTERNED STRUCTURE FOR A THERMAL INTERFACE

(75) Inventors: Bruno Michel, Yorktown Heights, NY (US); Thomas J. Brunschwiler, Yorktown Heights, NY (US); Hugo E. Rothuizen, Yorktown Heights, NY (US); Urs Kloter, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 634 days.

(21) Appl. No.: 12/538,797

(22) Filed: Aug. 10, 2009

(65) Prior Publication Data

US 2010/0037461 A1    Feb. 18, 2010

Related U.S. Application Data

(62) Division of application No. 11/141,932, filed on Jun. 1, 2005, now Pat. No. 7,748,440.

(30) Foreign Application Priority Data

Jun. 1, 2004    (EP) ..................................... 04012897

(51) Int. Cl.  
*B21D 53/02*    (2006.01)

(52) U.S. Cl. ..................... 29/890.03; 165/133; 165/185; 438/700

(58) Field of Classification Search ............... 29/890.03, 29/890.031, 890.039; 165/133, 185, 80.3, 165/80.4, 104.33, 104.34; 438/689, 692, 438/700; 361/704–705, 713; 257/706–707; 174/16.3

See application file for complete search history.

(56) References Cited

U.S. PATENT DOCUMENTS

| | | | | |
|---|---|---|---|---|
| 4,567,505 A | * | 1/1986 | Pease et al. ................... | 257/713 |
| 6,555,479 B1 | * | 4/2003 | Hause et al. .................. | 438/706 |
| 7,748,440 B2 | * | 7/2010 | Michel et al. ................. | 165/185 |
| 2001/0051431 A1 | * | 12/2001 | Chadda et al. ................ | 438/690 |
| 2004/0048476 A1 | * | 3/2004 | Jung et al. ..................... | 438/689 |
| 2004/0100779 A1 | * | 5/2004 | Kraft .............................. | 361/760 |
| 2004/0115923 A1 | * | 6/2004 | Macneil ........................ | 438/622 |

* cited by examiner

*Primary Examiner* — David Bryant  
*Assistant Examiner* — Ryan J Walters  
(74) *Attorney, Agent, or Firm* — Michael J. Buchenhorner; Vazken Alexanian

(57) ABSTRACT

A method for producing a plate with a first face with protrusions confined by first and second grooves includes steps of: etching recessed zones into a plate; depositing a photoresist layer on the plate; forming a passivation layer over the photoresist layer; removing the passivation layer at the bottom of the recessed zones; electroplating metal in the recessed zones; removing the passivation layer; removing the photoresist layer; and removing the semiconductor material to expose the first and second grooves.

1 Claim, 11 Drawing Sheets

| Arrays with posts | N | Relative Groove Width | Areal Fill Factor | First Groove (micron) | Second Groove (micron) | Third Groove (micron) |
|---|---|---|---|---|---|---|
| Selected patterns with threefold nested grooves | | | | | | |
| A | 6 | 9% | 69% | 400 | 60 | 10 |
| Post size | | | | 4500 | 750 | 110 |
| Array size | | | | 27200 | 4200 | 650 |
| B | 5 | 7% | 78% | 370 | 70 | 14 |
| Post size | | | | 5500 | 1100 | 200 |
| Array size | | | | 27530 | 5210 | 986 |
| C | 6 | 4% | 85% | 180 | 30 | 5 |
| Post size | | | | 4500 | 750 | 120 |
| Array size | | | | 27450 | 4440 | 715 |
| D | 5 | 4% | 85% | 200 | 40 | 8 |
| Post size | | | | 5500 | 1100 | 205 |
| Array size | | | | 27025 | 5245 | 1017 |
| Selected patterns with twofold nested grooves | | | | | | |
| E | 8 | 8% | 77.9% | 260 | 32 | |
| Post size | | | | 3500 | 405 | |
| Array size | | | | 27484 | 3208 | |
| F | 8 | 6% | 83% | 200 | 25 | |
| Post size | | | | 3500 | 410 | |
| Array size | | | | 27440 | 3255 | |
| G | 8 | 4% | 88.5% | 130 | 16 | |
| Post size | | | | 3500 | 416 | |
| Array size | | | | 27406 | 3312 | |
| Non-nested groove for comparison | | | | | | |
| H | 68 | | 84.8% | 32 | | |
| Post size | | | | 405 | | |
| Array size | | | | 27508 | | |

PATTERNED STRUCTURE FOR A THERMAL INTERFACE

CROSS-REFERENCE TO RELATED APPLICATIONS

This application is a division of, and claims priority from, commonly-owned, co-pending U.S. patent application Ser. No. 11/141,932, filed on Jun. 1, 2005; which application is incorporated in its entirety as if fully set forth herein.

FIELD OF THE INVENTION

This invention relates to a thermal interface with a patterned structure, a material interface with a patterned structure using capillary force and a method for producing a patterned structure for a thermal interface.

BACKGROUND

The interface between a device and a thermal sink is in the technical field of chip packages a dominant thermal resistance. For high-power electronic packages, chip hot-spots and cross-chip temperature gradients represent a significant portion of the total thermal resistance from chip to ambient. Microprocessor chips display non-uniform spatial power distribution with regions of concentrated heat flux. This results in significant temperature gradients within the chip. Since the maximum chip temperature is often the parameter that dictates the thermal reliability of electronic packaging, techniques of reducing chip temperature gradients are becoming important along with traditional techniques of reducing the package internal and external thermal resistance.

For reducing the thermal resistance between hotspots of a chip and a cooling device, it is known to use standoffs between the chip and a cooling device, wherein a paste with a low thermal resistance is displaced between the cooling device and the chip, filling up the volume between the standoffs, the chip and the cooling device. The standoffs improve the thermal conductivity between the chip hotspots and the cooling device; see for example Michael S. June and Kamal K. Sikka, "Using Cap-Integral Standoffs To Reduce Chip Hot-Spot Temperatures In Electronic Packages", Inter Society Conference on Thermal Phenomena, 2002, IEEE, pages 173 to 178.

Using standoffs between a chip and a cap is also known for enhanced cooling of single flip-chip electronic modules. The chip is between a substrate and a cap, wherein between the cap and the chip a thermal paste and standoffs are arranged; see e.g. K. K. Sikka et al., "Gap-Reduced Thermal Paste Package Design For Cooling Single Flip-Chip Electronic Modules", 2002 IEEE, Inter Society Conference on Thermal Phenomena, pages 651 to 657.

In U.S. Pat. No. 5,345,107, a cooling apparatus for an electronic device is disclosed that comprises a cooling solid body in close contact through a thermal conductive fluid with a heat transfer portion of the electronic device. On its one surface in contact with the electronic device, a number of grooves communicating with the outside of the heat transfer portion are arranged. A spring member for elastically pressing this cooling solid body on the electronic device is provided for forcing the cooling solid body into close contact with the electronic device by means of the thermal conductive fluid in a third layer. For transferring heat from the chip to a cooling device, a solid thermal conductor is arranged that comprises a number of grooves, each communicating with the outside of the heat transfer surface. The grooves are arranged in a perpendicular structure on the heat transfer surface and the capacity of the grooves is arranged to be larger than the volume of the high thermal conductive grease surrounded by the grooves and applied between two heat transfer surfaces. This construction allows the solid thermal conductor to be brought into close contact with the microchip carrier through the usually stable and thin high thermal conductive grease layer.

U.S. Pat. No. 5,052,481 describes a high conduction cooling module having internal fins and compliant interfaces for VLSI chip technology. A finned internal thermal device having a flat bottom contacts the chips, while corresponding trenches in a cooling hat mounted to a cold plate form gaps into which the fins of the finned internal thermal devices are slidably mounted. On a backside of the finned thermal device, grooves are arranged in a perpendicular structure. The grooves may be between 15 and 20 µm wide and deep, and spaced approximately 0.25 mm apart.

SUMMARY OF THE INVENTION

The present invention provides a thermal interface with a conducting material between two faces that provides a reduced thermal resistance between the faces. A further aspect of the invention is to provide a thermal interface that allows to attain a smaller distance between two faces that are connected by thermal conducting material.

It is a further aspect of the present invention to provide an interface between two faces that are held together by a capillary force with a fluid material between the two faces.

Furthermore, it is an aspect of the present invention to provide a plate with a patterned structure that allows a smaller distance between the plate and a second plate, wherein a thermal conducting material is arranged between the patterned structure and the second plate.

Another aspect is to provide an advantageous method for contacting two faces that are held together by a capillary force via a fluid material.

Another aspect is to provide a method of producing an element with first and second grooves that provides an interface with a low thermal resistance.

It is a further aspect of the invention to provide an interface between two faces that allows a capillary contact between the two faces by a fluid material.

A method for producing a patterned surface with first and second grooves is achieved by producing an element with the first face comprising protrusions that are confined by first and second grooves. The method having the following steps: etching recessed quadratic zones in a semiconductor plate, deposition of photoresist, passivation of the surface of the etched structure, anisotropic stripping of the passivation layer at the bottom of the groove, electroplating metal in the recessed quadratic zones, stripping of the passivation layer, stripping of the photoresist layer, etching back the semiconductor material generating first and second grooves between the metal structure. This method has the advantage to provide a semiconductor element with protrusions made of metal. The protrusions are precisely defined and strongly fixed in the semiconductor element because of the used process.

BRIEF DESCRIPTION OF THE DRAWINGS

The invention is best understood by reference to the detailed description which follows in conjunction with the accompanying drawings, wherein.

DETAILED DESCRIPTION OF THE INVENTION

The present invention provides a thermal interface with a conducting material between two faces that provides a reduced thermal resistance between the faces. A further object of the invention is to provide a thermal interface that allows to attain a smaller distance between two faces that are connected by thermal conducting material. It further provides an interface between two faces that are held together by a capillary force with a fluid material between the two faces.

Furthermore, the present invention provides a plate with a patterned structure that allows a smaller distance between the plate and a second plate, wherein a thermal conducting material is arranged between the patterned structure and the second plate. It also provides an advantageous method for contacting two faces that are held together by a capillary force via a fluid material. It also provides a method of producing an element with first and second grooves that provides an interface with a low thermal resistance.

These are accomplished by a thermal interface with two faces, wherein at least one face comprises first and second grooves, the first grooves having a larger width than second grooves. Each unit cell in between the first grooves is itself an array of protrusions separated by second grooves. Thus, the invention provides thermal interface with two faces that are in contact with each other by a thermal conducting material, wherein two types of grooves are arranged, namely first grooves having a larger width and/or depth than second grooves. The surface is subdivided into N sub-arrays by N−1 first grooves. Each sub-array is subdivided into N sub-arrays by N−1 second grooves.

The thermal interface with the first and the second grooves has the advantage that because of the smaller spacing between the second grooves the distance between the two faces and consequently the thermal resistance across the thermally conducting material is smaller. The first grooves that exhibit a larger cross-section or effective hydrodynamic radius than the second grooves assist the flowing of the thermally conducting material to a border area of the faces out of the interface. Therefore, a smaller gap could be attained by pushing the two faces together, squeezing out the thermally conducting material at a given pressure and duration.

In an embodiment, the first grooves are wider and deeper than the second grooves. The first grooves are preferably arranged to end up at a border of the array. The second grooves are all connected to a first groove for inner sub-arrays and to the border of the array for the outermost sub-arrays. Therefore, excess thermally conducting material could be better squeezed out of the interface between the two faces.

Advantageously, the protrusions cover more than 65% of the total area of the array. This improves the thermal conduction between the two faces. Advantageously, an entire chip is divided up into N sub-arrays wherein each sub-array is separated by N−1 first channels and includes N smaller elements that are separated by N−1 second channels. For an easier production process, the first grooves are structured with identical depth as the second grooves. Furthermore, the sub-arrays are advantageously also structured with identical depth which allows all features to be manufactured in one process.

In an advantageous embodiment, the first grooves are arranged in a crossed net structure, wherein half of the first grooves are directed in a first direction and the other half of the first grooves are arranged in a second direction. The first and the second direction are advantageously perpendicular to each other. Advantageously, the first grooves have the same distance from the neighboring first grooves in the first and in the second direction. In this embodiment, the second grooves are also disposed in a cross net structure. Advantageously, N*N sub-arrays are disposed that are divided by N−1 first grooves in on direction of space and N−1 first grooves that are situated perpendicularly to the first set. N is an integer number between 2 and 20. The protrusions that are confined by the first and second grooves advantageously comprise identical conducting faces. Advantageously a sub-array is divided in further sub-arrays that comprise smaller protrusions that are confined by third grooves. This embodiment constitutes a threefold nested hierarchical groove structure.

Second grooves which are the smallest grooves in a twofold hierarchical structure, having a width between 7 and 30 µm, are preferred. The protrusions between the second grooves preferably have a rectangular conducting surface, wherein a side of the rectangle has a length between 50 and 200 µm. Furthermore, it is advantageous to use first grooves having a smaller width than 300 µm. The protrusions preferably consist of metal. Good results can be attained by copper, that has a relatively low thermal resistance and exhibits good processability. Equally good results have been attained with aluminium nitride ceramics and silicon since these materials have a quite low thermal resistance and can be patterned well with high aspect ratios.

The invention also provides an interface between two faces that allows a capillary contact between the two faces by a fluid material. This object is achieved by a first and a second face, wherein at least one of the faces comprises first grooves and second grooves, the first grooves having a larger width and/or depth in comparison to the second grooves. The first and the second face constitute an interface and lie upon each other with the fluid material in between. The second grooves are at least partially filled with the fluid material. Because of the first and the second grooves, the first and the second faces could easily be pushed together, the second grooves providing a capillary force and the first grooves assisting an equal distribution of the fluid material. Advantageously, the second grooves are filled up with fluid material between 50 and 80% of their volumes. For attaining a good thermal conducting interface between the two faces and a capillary force, liquid metal, salt solutions, nanoparticle filled media, or liquid solder is preferably used as a fluid material.

A simple-to-use method for contacting the two faces using capillary force is achieved by a first face comprising fluid material along a first rim area and putting down the second face with a rim area on the first rim area of the first face. After contacting the first and second face along the respective rim, the first and the second face are flapped together. Because of the first grooves that are arranged in a perpendicular direction to the first rim area, the fluid material is pushed by the two faces along the whole interface between the first and the second face. Therefore, it is not necessary according to this method to distribute the fluid material over the whole area of the first or the second face.

A method for producing a patterned surface with first and second grooves is achieved by producing an element with the first face comprising protrusions that are confined by first and second grooves with the following steps: etching recessed quadratic zones in a semiconductor plate, deposition of photoresist, passivation of the surface of the etched structure, anisotropic stripping of the passivation layer at the bottom of the groove, electroplating metal in the recessed quadratic zones, stripping of the passivation layer, stripping of the photoresist layer, etching back the semiconductor material generating first and second grooves between the metal structure. This method has the advantage to provide a semiconductor element with protrusions made of metal. The protrusions are precisely defined and strongly fixed in the semiconductor element because of the used process.

A second method for producing a patterned surface with first and second grooves is achieved by producing a plate with the first face comprising protrusions that are confined by first and second grooves with the following steps: Spin coating a UV-curable polymer material onto a metal surface, exposing part of the polymer and removing the non-exposed parts of the surface to produce larger and smaller ridges corresponding to the first and second grooves, electroplating metal features between the ridges and polishing the surface to create flat posts. The structure is functional after the exposed polymer ridges have been removed by chemical degradation due to an acid or oxidation. The second method is expanded to produce first grooves that are deeper than second or third grooves by combining two coating, exposure, plating and polishing steps as follows: In the first run only large channels are formed. Onto the polished surface a second layer of polymer is coated and exposed with ridges corresponding to the second grooves. The same development, plating and polishing process is then repeated to fill the spaces between the second grooves. The final structure then becomes functional by removal of the polymer filling the first and second grooves. This method has the advantage of producing metal protrusions separated by grooves directly on a conducting copper cooler and that it can be extended to produce first and second channels with a different depth.

Figure 1:
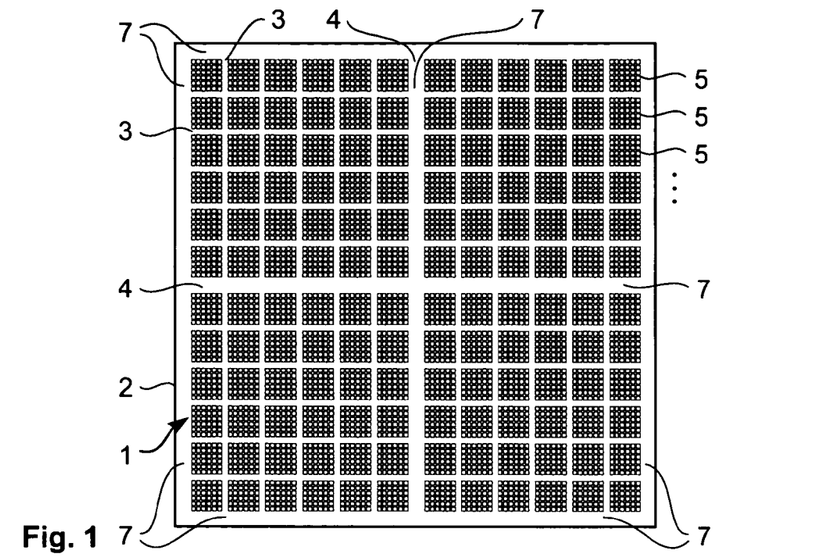
FIG. 1 is an illustration of a subset of plate with a patterned surface with first and second grooves, wherein the first grooves separate 2.times.2 sub-arrays that are divided into 6.times.6 smaller areas by second grooves.

FIG. 1 illustrates a top view of a first face 1 of a first plate 2. The first face 1 comprises a patterned surface with protrusions 5 that are separated by second grooves 3. The second grooves 3 are in this embodiment arranged in a rectangular crossed net structure such that there is a first group of second grooves 3 that are arranged parallel to each other and a second group of second grooves 3 that are arranged parallel to each other, but perpendicularly to the second grooves 3 of the first group. The protrusions 5 form an array. This array is divided into sub-arrays 7 by first grooves 4 that are perpendicularly arranged to each other in a crossed structure. The sub-arrays 7 are identically constructed. Each sub-array 7 has the shape of a square with here six protrusions 5 along one side of the square. Sub-arrays 7 on a different hierarchical level are also identically constructed. FIG. 1, however, only shows a 2.times.2 subset of the entire 6*6 array of sub-arrays 7.

The protrusions 5 are advantageously identical and comprise a planar thermally conducting surface 15 with the shape of a square. In the depicted embodiment, the first grooves 4 have a larger width and a larger depth than the second grooves 3. The effective hydrodynamic radius of the first grooves 4 is hence larger than the effective hydrodynamic radius of the second grooves 3. The first plate 2 comprises e.g. a semiconductor, metal, or ceramic material.

Figure 2:
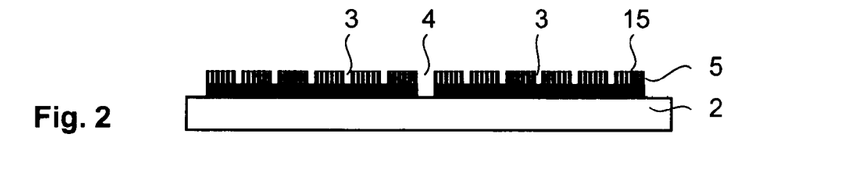
FIG. 2 shows a sectional view of the first plate with first grooves deeper than second grooves.

FIG. 2 shows a sectional view of the first plate 2 of FIG. 1.

Figure 3:
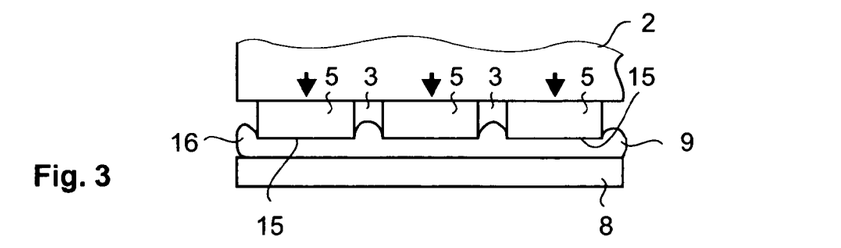
FIG. 3 shows a fragmentary sectional view of the first plate that is pushed onto a second plate.

FIG. 3 depicts an enlarged sectional view of the first plate 2 that is brought into contact with a second plate 8, wherein between the first and the second plate 2, 8 a fluid material 9 is arranged. Only the front endings of three protrusions 5 of the first plate 2 are depicted that are separated from each other by the second grooves 3. The second plate 8 comprises a second face 16 that is constituted by an even surface. For improving the thermal conductivity between the first plate 2 and the second plate 8, the fluid material 9 comprises a thermally conductive material. As a fluid material e.g. thermal paste, solder, fluid metal etc. may be used. Furthermore, the protrusions 5 may comprise thermally conductive material, e.g. metal or other highly conductive materials. Advantageously, the protrusions 5 comprise copper. For achieving a higher conductivity, the thermally conducting surfaces 15 of the protrusions 5 exhibit a larger side-length, e.g. in the order of tens of micrometers, than the width of the second grooves 3, e.g. in the order of μm. The higher the fill factor of the thermally conductive material the better the thermal conductivity.

In a preferred embodiment the protrusions 5 should cover more than 65% of the area of the first plate 2. On the other hand, the flow resistance of fluidic networks scales according to the relation with inverse fourth power of the smallest groove dimension or, more precisely, with the inverse fourth power of the effective hydrodynamic radius. The lower the desired flow resistance, the shorter or wider the grooves should be. There is hence a tradeoff between the requirements of the protrusion size, groove width and groove length in one set of grooves. The grooves 3, 4 constitute channels between the two plates 2, 8. However, the patterned surface of the first face 1 comprises the nested grooves 3, 4 with different length and width. The nested grooves 3, 4 are designed to fulfill the conflicting requirements of all three parameters. The result is that the patterned surface comprises sub-arrays with the second grooves 3, wherein the arrays are confined by the first grooves 4. The smaller width of the second grooves 3 leads to a better heat transfer between the first plate 2 and the second plate 8. Furthermore, the squeezing resistance of the patterned surface with the flow resistance of micro-channels, in this example the second grooves 3, can be combined with the squeezing resistance of the first grooves 4 as shown in FIG. 1. Advantageously, the first and the second grooves 4, 3 are constructed in such a way that the flow resistance of the fluid material 9 flowing along the first grooves 4 is at least $N^3$ times lower per unit length than the resistance of the second grooves 3 where N is the number of elements of a sub-array 7.

The larger effective hydrodynamic radius of the first grooves 4 improves the flow of the fluid material 9 that is squeezed out of the interface between the first plate 2 and the second plate 8. At the same time, the smaller width of the second grooves 3 improves the thermal conductivity between the first plate 2 and a second plate 8.

Hierarchic nesting is a process where a set of rules are inherited from parents to children and to the children of the children. In the most simple approach the rules are: child arrays, posts, or channels are N times smaller than their parents with the overall chip dimension being the primary parent.

The rules can be different for different aspects: Channel depth may not vary at all or may vary with a smaller linear factor or another relation (e.g. logarithmic). In the case of channels a hierarchic structure reduces the flow resistance for the moving paste with the fourth power of N compared to non-nested channels e.g. one single array of 68*68 405 micron wide posts with 32 micron channels. (See FIG. 5A). In the case of flat surfaces or non nested channels the gap between the first face 2 and second face 8 is designed large enough e.g. >50 micron to allow paste transport while in the an embodiment using nested channel arrays the channels take over the function of transport of the fluid material 9 below a gap width of 25 microns and, therefore, allow thermal paste gaps between the first face 2 and second face 8 with a width below 1 micron.

Experiments have shown that two levels of nesting with array sizes from 8*8 to 10*10 protrusions 5 are sufficient for the formation of low thermal resistance gaps at small normal force/pressure with pastes with relatively low viscosity used as the fluid material 9. On the other side, three levels of nesting with smaller array sizes of 5*5 to 6*6 protrusions perform better at a relatively low normal force/pressure with pastes with relatively high viscosity. Flow resistance scales with the fourth power of its effective radius which is 2*width*depth divided by width+depth for a rectangular groove. This would lead to a dimensionality of the channels in the adjacent hierarchical unit to be proportional to the fourth root of the array size N. Since the amount of the fluid material that is transported by pressing the first and the second plates 2, 8 together, scales with the area of the sub-arrays which is $N^2$, the scaling will be reduced to a quadratic root rule which would lead to a scaling of both width and depth with square root of N. Since the grooves will advantageously be fabricated by lithography processes and it is preferable to have them all with the same depth, the depth is then constant and the width scaling that approximates the overall scaling rule best is a width scaling of N.

Figure 4:
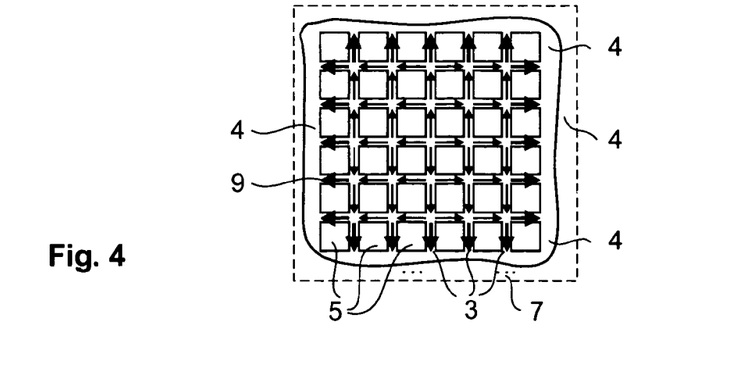
FIG. 4 shows a view of a sub-array on face 2 through a transparent face 1 with arrows illustrating the flow of fluid material along the second channels during the connecting process of the first and second plate.

FIG. 4 depicts a schematic view of the flow of the fluid material 9 that is squeezed beyond the second grooves 3 into the first grooves 4 that confine the sub-array 7 that is shown in FIG. 4. FIG. 4 shows the flow pattern of the fluid material 9 as it can be seen through transparent plates 2, 8.

The resistance or pressure P generated by a Newtonian liquid flowing in a capillary channel is given by the laws governing Poiseuille Flow:

$$P = V*1*8*\eta/r_{eff}^4,$$

wherein V is the volume in m³, l is the length of the capillary channel in m, η is the dynamic viscosity in (Pa s) or (N s/m) and $r_{eff}$ is the effective radius in m which is calculated by the rule: $r_{eff} = 2*a*b/(a+b)$ for a rectangular capillary, with a and b being the dimension of the rectangular cross section. Therefore, the smaller and longer capillary channels are, the bigger is the resistance they offer to the flow of the fluid material 9 that is squeezed out by pushing together the first and the second plate 2, 8. If the fluid material 9 is a non-Newtonian fluid that partially deviates from the law depicted above, a different scaling rule that results in slightly larger child channels is optimal (e.g. channel width scaling linear with factor N−1 or nonlinear).

Figure 5A:
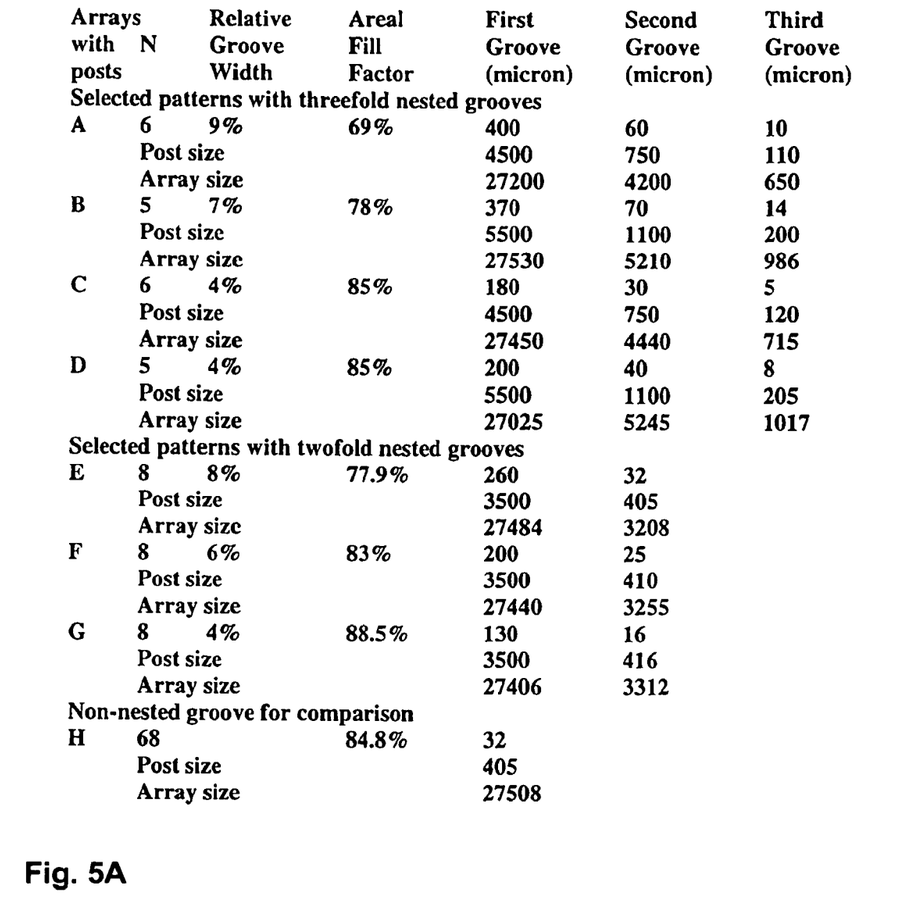
FIG. 5A shows a table of patterns for a two-fold and a three-fold nested hierarchical grooved first plate.

FIG. 5A depicts a table with data for selected patterns with three-fold nested grooves and with two-fold nested grooves. The array size describes the length in units of a side of a quadratic array. The pattern size describes the length of a side of a quadratic pattern. The first column contains an identifier for a respective design. The second column gives the number N of protrusions 5 per side length of the array.

The third column gives the percentage of the groove width with respect to the sum of its width and the width of a protrusion 5. If the relative groove width is 9%, the corresponding protrusion width is 91%. The fourth column gives the area fill factor of the whole chip, i.e. the percentage of the area that is covered by the conducting surfaces 15 of all protrusions 5 with respect to the surface including the grooves 3, 4.

In the 5th column are the data for first grooves. In the 6th column are the data for the second grooves and in the 7th column are the data for the third grooves. The values of a first example for a three-fold nested channel pattern are shown in the first line of the table. In the first example the first groove (first line and first column) has a width of 400 μm, the second groove 4 (first line, second column) has a width of 60 μm and the third groove (first line, third column) has a width of 10 μm.

Figure 5B:
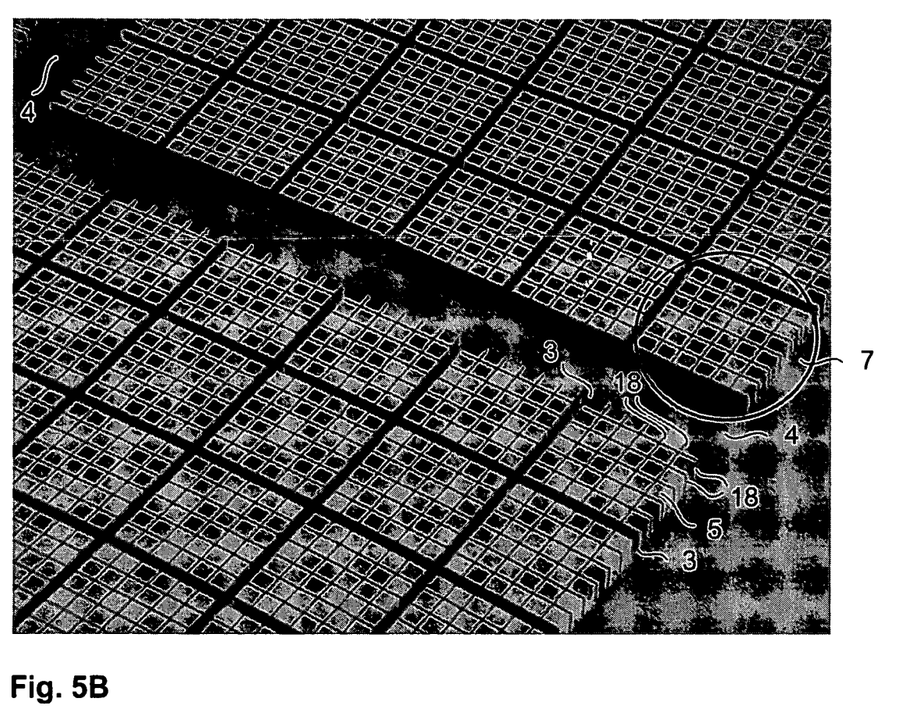
FIG. 5B depicts a threefold nested hierarchical channel interface structure.

FIG. 5B depicts a 3-d view of an embodiment of a three-fold nested groove pattern. There is shown a pattern with a cluster of arrays, each array comprising 36 sub-arrays 7. Each sub-array comprises 36 protrusions 5. The protrusions 5 are separated by third grooves 18. The sub-arrays 7 are separated by the second grooves 3. The arrays are separated by the first grooves 4. The pattern itself has a quadratic shape as the arrays and the sub-arrays 7 have.

As can be seen, the grooves 3, 4, 18 define a nested pattern structure that can be extended to any higher degree of nesting. The degree is defined as the number of different size levels of the grooves. The example of FIG. 5B exhibits three groove sizes, and this concept can be extended to 4 and more by introducing another groove hierarchy with larger or smaller groove sizes.

In this embodiment, the first grooves 4 are the largest grooves, and their size is calculated as follows: Chip size/ N*linear fill factor. The second grooves 3 are one factor N smaller than the first grooves 4. The third grooves 18 are a factor $N^2$ smaller than the first grooves 4. To extend this embodiment by another nesting level or degree, fourth grooves would be dimensioned a factor $N^3$ smaller than the first grooves 4, fifth grooves would be a factor $N^4$ smaller than the first grooves 4, and so on. . . . As preferred values, N would be selected approximately eight for a two level hierarchical, six for a three level hierarchical, four for a four level hierarchical, and three for a five to six level hierarchical groove network, and two for seven level or higher hierarchical nesting levels.

Experiments have proven that the first grooves 4 are preferred to have a maximum width of 500 µm. The conducting surface 15 of the protrusions 5 is preferred to constitute more than 65% of the total area of the first face 1. Even more advantageous, the conducting surfaces 15 of the protrusions 5 should sum up to more than 75% of the total area of the first face 1. The first and the second grooves 4, 3 (the total area of all grooves 4, 3 for a twofold hierarchical network and of all grooves 4, 3, 18 for a threefold hierarchical groove network) therefore advantageously comprises less than 35% of the total area of the first face 1 and even more advantageously less than 25% of the total area of the first face 1. For quadratic sub-arrays 7 in a twofold hierarchical nested network a number of eight to fifteen protrusions 5 along one side that are separated by the second grooves 3 attain a good result for producing a thermal interface with the two plates 2, 8. The width of the second grooves 3 is preferably between 5 and 50 µm. A preferred maximum width of the first grooves 4 is 500 µm. The depth of the first and the second grooves may preferably be in the range of 25 µm to 250 µm.

The surfaces 15 of the protrusions 5 might also have other shapes, for example a circular shape or a multi-corner face with more than four corners e.g. hexagons. Also, the arrangement of the first and second grooves 4, 3 might show other structures. It is not necessary that the first grooves 4 are arranged in parallel or that a part of the first grooves 4 is arranged perpendicularly to another part of the first grooves 4. Furthermore, the second grooves 3 need not be disposed in a cross structure but can be arranged in any other structure. The embodiment of the FIGS. 1 to 5 describes the situation where an excess of the fluid material 9 that has a predetermined thermal conductivity is available. The grooves 3, 4 are filled by pushing the first and the second plate 2, 8 together and the excess amount of fluid material 9 is squeezed out of the periphery of the first and the second plate 2, 8 by the first and the second grooves 3, 4. The process of forming thermal contact between the first and the second plates 2, 8 gets faster the fewer excess or even if substantially the exact amount of fluid material 9 necessary to fill the groove network is applied.

Figure 5C:
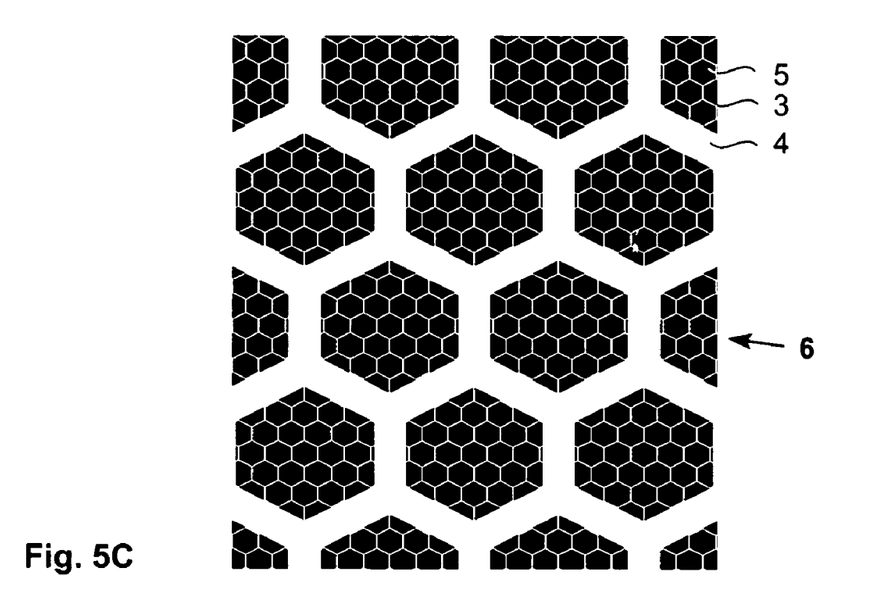
FIG. 5C shows a patterned surface with a twofold nested hierarchical channel structure.

FIG. 5C depicts a second patterned structure 6 of a plate comprising first and second grooves 3, 4. The second grooves 3 surround the protrusions 5 and have the shape of a hexagonal lattice structure. Arrays of the protrusions 5 are surrounded by the first grooves 4 that constitute a second hexagonal lattice structure. The first and the second grooves 4, 3 exhibit the features as explained above. The second hexagonal lattice structure comprises a larger lattice parameter in comparison to the first hexagonal lattice structure, thereby forming a two-level nested groove network.

Figure 5D:
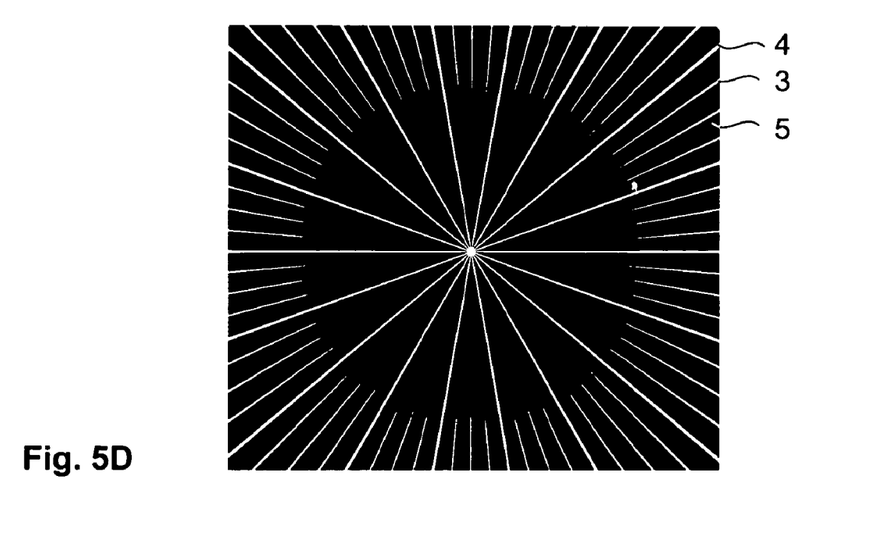
FIG. 5D depicts a surface with a centrally symmetric channel structure.

FIG. 5D depicts a further embodiment of a patterned structure with second grooves 3, first grooves 4 and protrusions 5. The first grooves 4 are guided in radial directions to the centre of the structure and have a larger width and/or depth, respectively effective hydrodynamic radius than the second grooves 3. The second grooves 3 are guided in radial directions but not extended to the central point of the structure.

Figure 5E:
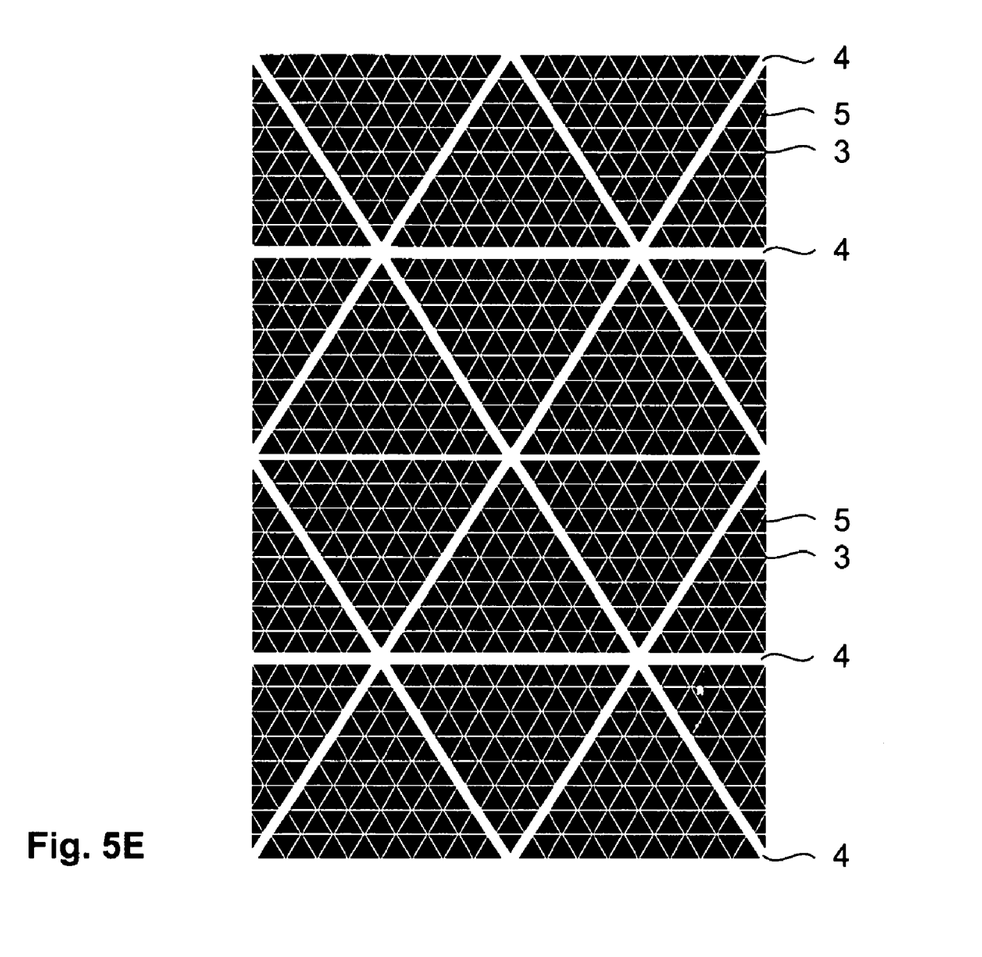
FIG. 5E depicts a further embodiment of a hierarchical nested channel structure.

FIG. 5E depicts another patterned structure comprising first and second grooves 4, 3, wherein the protrusions 5 have a three-cornered shape surrounded by a structure of second grooves 3. The first grooves 4 surround the arrays of protrusions 5, the arrays themselves having a three-cornered shape.

The invention is not limited to the shown embodiments of the patterned surfaces, but could also be used with other groove structures comprising first and second grooves 4, 3, that are hierarchically nested as explained above.

The situation is different, however, if the available volume of the fluid material 9 is smaller than the total capacity of the first and second grooves 3, 4. Here, the fluid material 9 moves shorter distances, e.g. a maximum of half of the width of the protrusion 5 and it is essentially entirely buffered in the spaces between the protrusions 5. If the first and the second grooves 4, 3 are only partly filled up with the fluid material 9, the fluid material 9 can serve as a reservoir to accommodate gap changes between the first and the second plate 2, 8 during thermal cycling.

When the surfaces of the first and the second plate 2, 8 are treated for increasing their wettability, a capillary force can contribute to attracting the surfaces towards each other without or with reduced external pressure. When the second grooves 3 serve as capillary grooves 3 that are not completely filled with the fluid material 9, a normal force is created that works to reduce the gap between the conducting surface 15 of the protrusions 5 and the surface of the second plate 8. The capillary force also scales with the inverse of the second power of the effective hydrodynamic radius.

Figure 6:
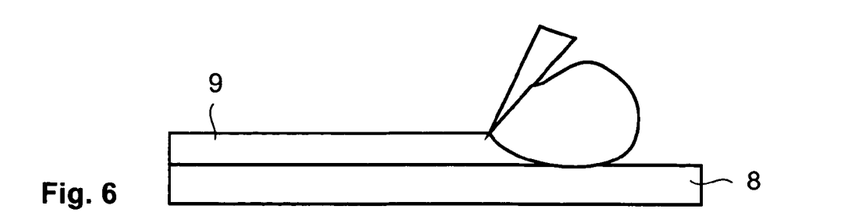
FIG. 6 shows a sectional view of a second plate that is covered by a fluid material in a predetermined depth.

FIG. 6 shows a second plate 8 that is covered with fluid material 9. The more precise the dosing of the fluid material 9 across the surface of the second plate 8, the better can the capillary effect be exploited. By use of doctor blading a layer of fluid material 9 with a predetermined height can be obtained. The layer of the fluid material 9 should be thick enough to promote wetting on all protrusions 5 of the first plate 2 over the entire surface. On the other side, the fluid material layer should be thin enough such that the volume of the first and second grooves 4, 3 is larger than the volume of the fluid material 9. For a good overall thermal conduction, the fill factor of the protrusions 5 is preferably larger than 75% of the area of the interface between the first and second plate 2, 8. A typical example is a protrusion size of 100 µm and second grooves 3 with 10 µm width and 100 µm depth. This represents an area fill factor of 21% (79% for the protrusions). In such a case, the maximum capacity of the first grooves 4 is the depth of 100 µm multiplied by the area fill factor of the first grooves that is 21%. The capillary force generated by this set-up assuming a full wettability is about 15 kPa which is close to the typical clamping force in a processor package. It is preferable that the first grooves 3 exhibit a width that is smaller than its depth, hereinafter referred to as "narrow first groove" to increase capillary pressure. A second reason for preferring this type of cross-section is the thermal conduction path, since narrow first grooves do not significantly affect the heat conduction since heat can spread laterally from the protrusions 5 across the remaining gap and the second grooves 3 into the first plate 8. This approach works better with fluid material 9 having a lower viscosity. The thermal or electrical conductivity of the fluid material 9 advantageously becomes less important since the main conduction path is through a thin layer of fluid material 9 that is arranged in the interface between the first and second plate 2, 8. With the proposed patterned surface of the first plate 2 distances between the first and second plate 2, 8 down to 1 µm are attainable. Therefore, the thermal/electrical path goes through a 1 µm thick layer of fluid material only.

Figure 7:
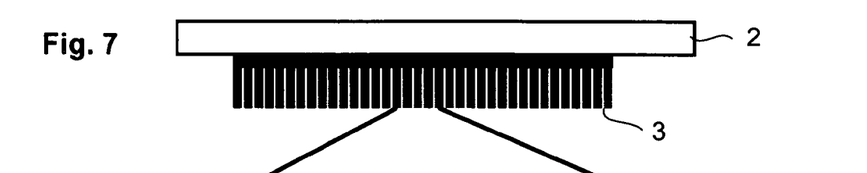
FIG. 7 depicts a further embodiment of a first plate with first grooves that generate a capillary force in contact with fluid material.

FIG. 7 depicts a second embodiment of a first plate 2 that comprises a patterned surface with second grooves 3 wherein the second grooves 3 are embodied in such a dimension that a capillary force is generated when the second grooves 3 are brought in contact with fluid material 9 that is arranged on a second plate 8.

Figure 8:
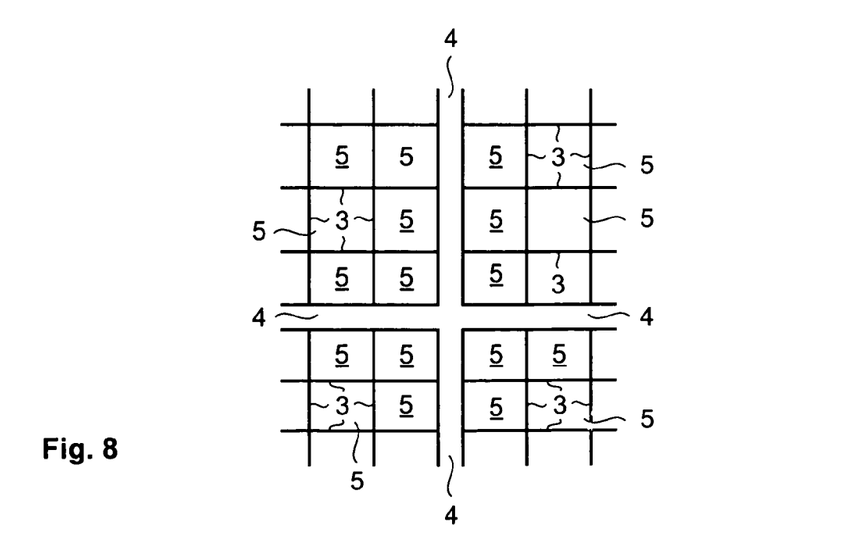
FIG. 8 depicts a schematic view of the patterned surface of the first plate of FIG. 7.

FIG. 8 depicts a top view on the patterned surface of the second embodiment of the first plate 2. In this embodiment, the second grooves 3 are arranged as straight and parallel channels. The first grooves 4 that have a greater width and/or a greater depth than the first grooves 3 are arranged perpendicularly to the second grooves 3.

Figure 9:
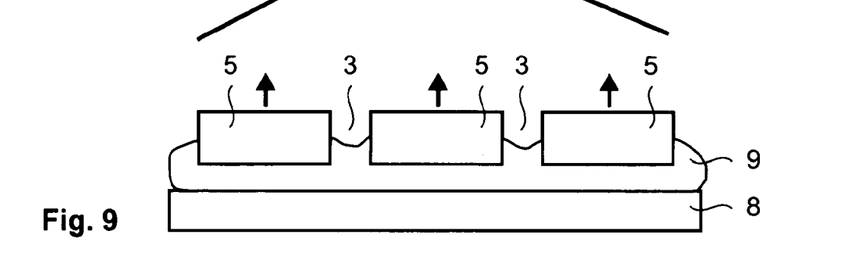
FIG. 9 shows an enlarged segmental sectional view of the protrusions of a first plate in contact with a fluid material on the surface of a second plate.

FIG. 9 depicts a fragmentary sectional view of the protrusions 5 of the first plate 2 of FIG. 7. The first plate 2 lies upon the second plate 8 with a plane surface and the fluid material 9 in between. Therefore, the first and the second plate 2, 8 are held together by the capillary force. The fluid material 9 is for example a polymer, a solder or a liquid metal.

Figure 10:
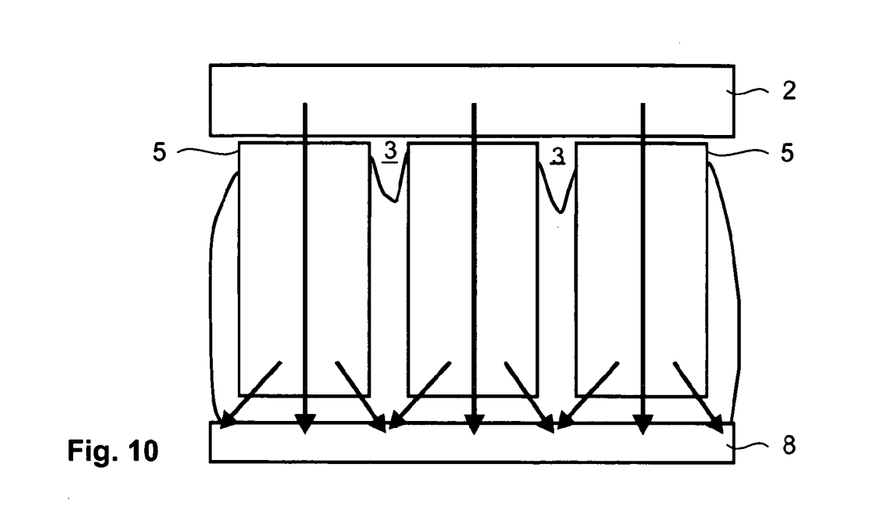
FIG. 10 illustrates an enlarged fragmentary sectional view of a first and second plate depicting the heat flow by arrows.

FIG. 10 depicts a fragmentary sectional view of a first plate 2 with protrusions 5 and a second plate 8. The second grooves 3 that are arranged between the protrusions 5 are not totally filled up with the fluid material 9. The heat flow path through the patterned surface of the first plate 2 is shown by arrows. The heat flow is concentrated in the thermally conducting protrusions 5 and crosses only a small gap filled with fluid material 9.

Figure 11:
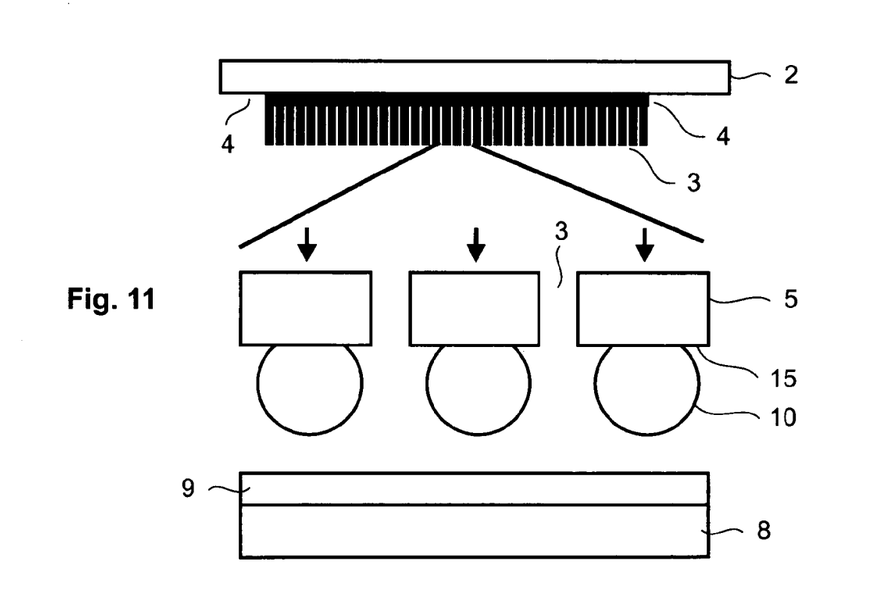
FIG. 11 shows a first and a second plate, wherein on the protrusions of the first plate solder balls are arranged before contacting the first and the second plate.

FIG. 11 depicts a first plate 2 with a patterned surface with the second grooves 3. The patterned surface also comprises the first grooves 4. The second grooves 3 define the protrusions 5 as explained above. The shape of the protrusions is the same as in FIG. 1. Here the protrusions 5 comprise solder balls 10 on their conducting surface 15. This method works well with solder balls and liquid metals. In this case the solder balls or the solder layer have the chance to make contact with the conducting surface 15 before the second grooves 3 are filled and the capillary force pulls the solder away from the desired place and creates voids. With this capillary pull device, solder joints can be formed at room temperature for liquid metals and the attachment force can reach values above 0.3 bar.

Figure 12:
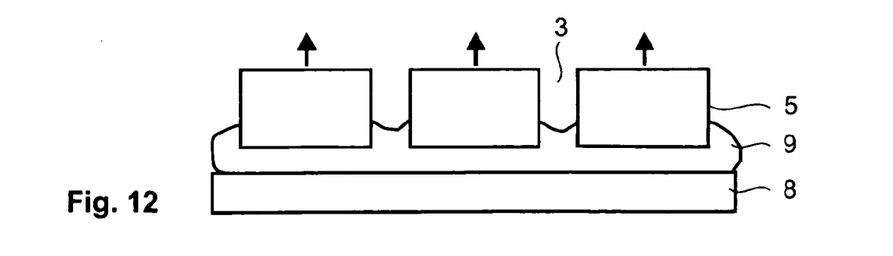
FIG. 12 shows an enlarged fragmentary sectional view of the first and second plate that are brought in contact with each other.

FIG. 12 depicts a situation in which the first and second plates 2, 8 are approached to each other and the first and the second plates 2, 8 are pulled to each other by the capillary force. The first grooves 4 are used as communicating joint trenches that allow the metal to be applied to one side of the contact front to propagate over the entire interface of the first and second plate 2, 8. The resulting gap between the protrusions 5 and the second plate 8 is the same as the width of the smallest capillary trenches that are constituted by the first grooves 3. The wider second grooves 4 may act as paths with lower resistance for distributing the fluid material 9 but will not significantly contribute to the capillary pull.

Figure 13:
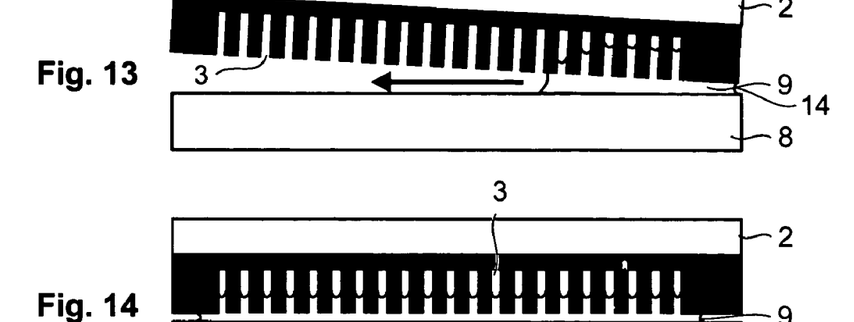
FIG. 13 shows a third embodiment of a first and second plate with a fluid material arranged at a rim area of the first and second plate.
Figures 14, 15:
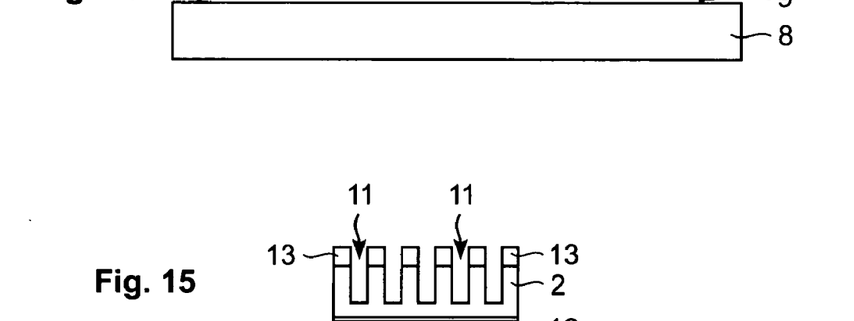
FIG. 14 depicts a sectional view of the first and second plate in contact.
FIG. 15 depicts a first step of a fabrication process for a first plate made of semiconductor with etched grooves.

FIG. 13 depicts a sectional view of a first and a second plate 2, 8 wherein at a first rim area of the first and second plate 2, 3, free fluid material 9 is disposed. The second plate 2 is laid down with a rim edge on a first rim edge 14 of the second plate 8. Then the first plate 2 is flapped over a rotating axis that is near the first rim edge 14 of the second plate 8, down onto the second plate 8. Because of the first grooves 4 that are arranged perpendicularly to the depicted second grooves 3, the fluid material that is disposed at the first rim edge 14 is squeezed over the whole interface between the first and the second plate 2, 8. This situation is shown in FIG. 14. The volume of the fluid material 9 is less than the volume of the first and second grooves 4, 3 to provide a capillary force between the first and the second plate over the fluid material 9.

Using this embodiment and method, a reworkable liquid metal zipper can be formed. By means of this system a contact is formed when a predetermined amount of fluid material 9, i.e. metal is added to fill the capillary system of the first grooves 4 to about 50 to 75%. The contact is stable against a vertical force to 0.5 bar for capillaries with a width in the order of 5 µm. The second or third grooves 3, 18 that constitute the capillary trenches may have a width ranging between 1 and 20 µm. The connection between the two plates 2, 8 is not stable against lateral displacement and therefore, mechanical locking features against the lateral displacement of the two plates 2, 8 are provided. The contact between the two plates 2, 8 forms quickly and the metal in the first and second grooves 4, 3 provides a buffer to re-supply evaporated, lost or oxidized fluid material 9 during the life time of the contact. In order to prevent oxidative degradation of the fluid material, the process may be carried out in the absence of oxygen i.e. in the presence of nitrogen or other inert gases. For release of the contact, a surplus of metal can be added to overfill the capillary system and thereby separate the two surfaces until they can be pulled apart mechanically.

The FIGS. 15 to 20 depict different processes steps of a fabrication process for the first plate 2 with first and second grooves 4, 3. FIG. 15 depicts a sectional view of a semiconductor first plate 2 with protrusions 5 and recessed quadratic zones 11. Upon the surface of the first plate 2, a photoresist 13 is arranged. Several processes can be used to fabricate high-aspect ratio patterned interfaces. Here the photoresist patterning step is performed on silicon, followed by a deep trench etch as shown in FIG. 15. The first plate 2 might be part of a CMOS chip, wherein the recessed zones 11 were etched into the backside of the CMOS chip.

Figure 16:
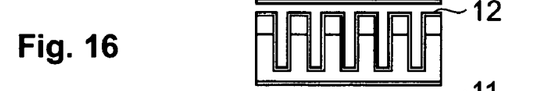
FIG. 16 depicts a second step after depositing an electrical passivation layer.
Figure 17:
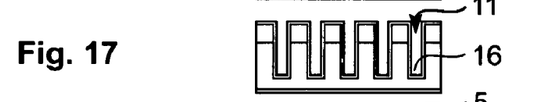
FIG. 17 shows a third step after anisotropic stripping of the passivation layer from the bottoms of the trenches.

After this step, an electrical passivation layer 12 is deposited on the surface of the patterned first plate 2 and the photoresist 13. This is shown in FIG. 16. Then, the electrical passivation layer 12 is stripped off in the bottoms of the recessed zones 11, as shown in FIG. 17. The results are free-bottom faces 16 in the recessed zones 11.

Figure 18:
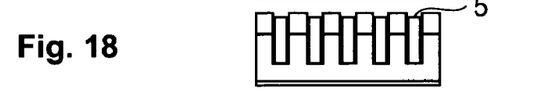
FIG. 18 shows a fourth step after electroplating a copper mesa.

In a further step, the protrusions 5 are formed by filling a material into the recessed zones 11 as shown in FIG. 18.

Figure 19:
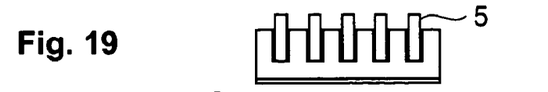
FIG. 19 shows a fifth step after a CMP process and a stripping of the photoresist and passivation layer.

Advantageously, a metal or another material that has a comparable thermal conductivity is used for the protrusions 5. In the preferred example, copper is deposited by an electroplating process. Depending on the embodiment, the metal may be deposited to a higher level than the surface of the first plate 2. After this, a chemical-mechanical polishing process is used for leveling the surface of the protrusions 5 down. Subsequently, the photoresist and passivation layers are stripped off. This fabrication status is shown in FIG. 19.

Figure 20:
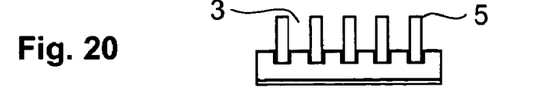
FIG. 20 shows a sixth step after the back etch of silicon with protrusions made of copper that are patterned by first and second grooves.

After this, the semiconductor material of the first plate 2 is etched back until a given depth in order to provide a patterned surface with protrusions 5 and with the first and second grooves 4, 3 as explained in the above embodiments of the first plate 2. This process status is depicted in FIG. 20.

A patterned surface with first and second grooves 4, 3 can be fabricated by the following steps: A metal plate 21 is spin-coated with an ultraviolet-curable polymer material. The polymer fill is partly exposed in a given structure to ultraviolet light. The non-exposed parts of the polymeric film are removed in order to produce larger and smaller ridges corresponding to the first and second grooves 4, 3. The ridges are filled up with metal structures by a metal-electroplating process. Thereafter, the surface is polished in order to create flat posts. The structure is functional after the exposed polymer ridges have been removed by means of chemical degradation with an acid or by means of oxidation. Using this method provides first and second grooves 4, 3 that are different in width, but have the same depth.

The FIGS. 21 to 26 depict a further improved process for producing first and second grooves comprising different widths and different depths.

Figure 21A:
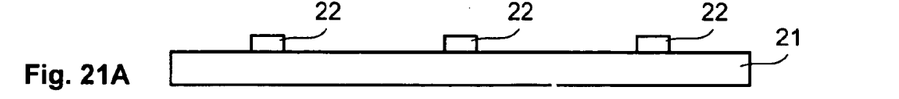
FIGS. 21A and 21B depict a first step of second fabrication process with a photoresist ridges on metal.

FIG. 21A depicts a sectional view of a metal plate 21 with a first polymer structure 22 that has been produced on the metal surface.

Figure 21B:
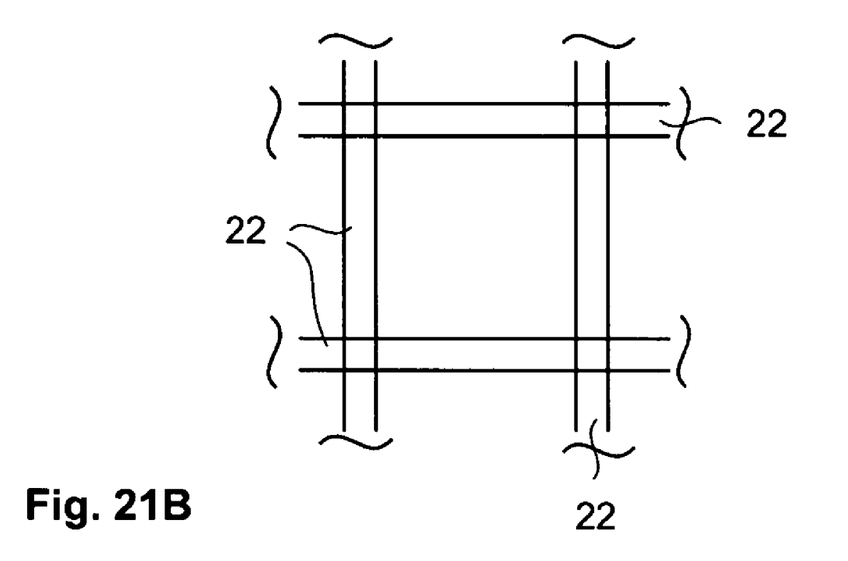
Figure 22:
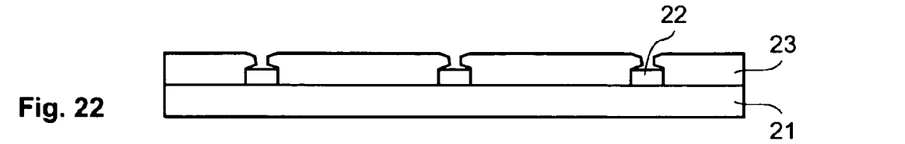
FIG. 22 depicts a second step after electroplating a first copper structure.

FIG. 21B depicts a partial view of the first polymer structure 22 that has the shape of perpendicularly crossed straight lines. In a second step, a first filling layer 23 is deposited on the metal plate 21. Advantageously, the first filling layer 23 is made of metal and the metal is deposited by an electroplating process. The height of the first filling layer 23 is larger than the height of the first polymer structure 22, as shown in FIG. 22.

Figures 23, 24B:
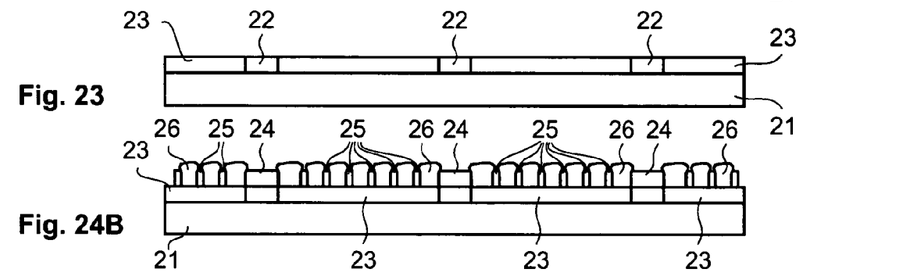
FIG. 23 shows a third step after chemical mechanical polishing of the electroplated copper.
FIGS. 24A, 24B, and 24C show a fourth step with second photoresist ridges on the first electroplated copper.
Figure 24A:
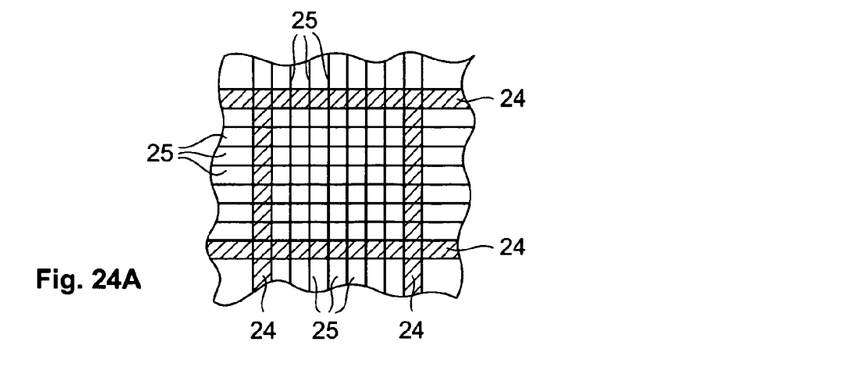

The surface of the first filling layer 23 is polished down to the surface of the first polymer structure 22, as shown in FIG. 23. In a further process step shown in FIG. 24B, a second polymer structure 24 is deposited on the surface of the first filling layer 23 and the first polymer structure 22. The second polymer structure 24 comprises a first structure part 24 that is preferably identical to the first polymer structure 22. Furthermore, the second polymer structure comprises a second structure part 25 that has the structure of second grooves 3. FIG. 24A depicts the respective view of the second polymer structure comprising first and second structure parts 24, 25.

The first structure part 24 has the shape of perpendicularly arranged straight lines. The second structure part 25 also has the shape of perpendicular straight lines, however, the distance between neighboring parallel lines is smaller than the distance between the straight lines of the first structure part 24. In the shown embodiment, six straight lines of the second structure part 25 are arranged between two parallel straight lines of the first structure part 24.

The second polymer structure 24, 25 is arranged upon the first polymer structure, wherein the first structure part 24 is identical to the structure of the first polymer structure 22 and directly arranged on top of the first polymer structure 22. The second structure part 25 is arranged within the first structure part 24.

Figure 24C:
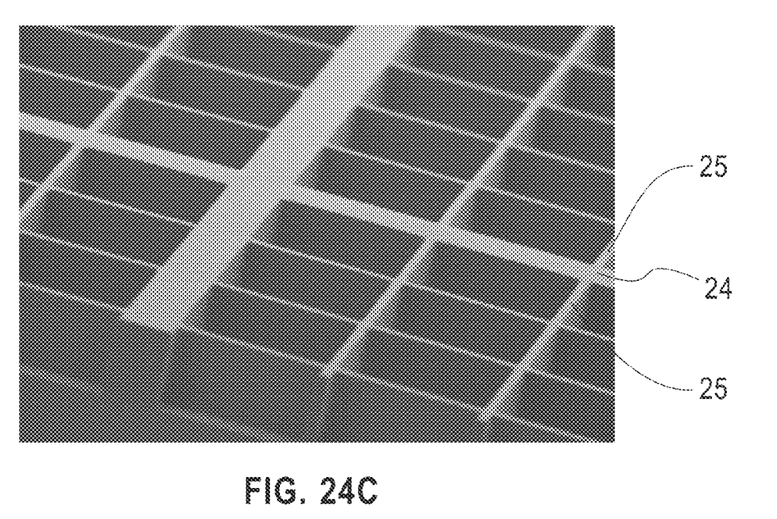

FIG. 24C depicts a perspective view of a sectional part of the second polymer structure with the first and the second structure part 24, 25.

The second polymer structure is filled up by a second filling layer 26. Advantageously, the second filling layer 26 is built up by a metal that is deposited by an electroplating process on the surface of the first filling layer 23 that is not covered by the second polymer structure. The second filling layer 26 is filled up over the surface of the second polymer structure 24, 25, as shown in FIG. 24B. Preferably, the first and second polymer structure is made of photoresist.

Figure 25:
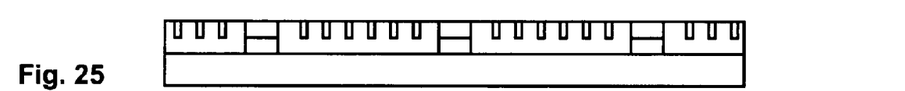
FIG. 25 shows a fifth step with electroplated copper after chemical mechanical polishing.

Thereafter, the surface of the second filling layer 26 is polished as shown in FIG. 25. In a following process step, the first and the second polymer structure 22, 24, 25 is removed, providing a structure of first and second grooves 4, 3, as shown in the cross-sectional view of FIG. 26A. This method has the advantage of producing metal protrusions 5 that are separated by first and second grooves 4, 3, directly in a conduction copper cooler that is constituted by the metal plate 21.

Figure 26A:
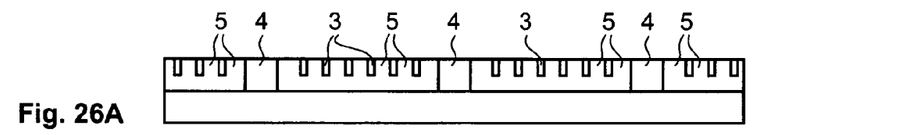
FIGS. 26A and 26B show a sixth step after the removal of the photoresist from both the first and second patterning step.
Figure 26B:
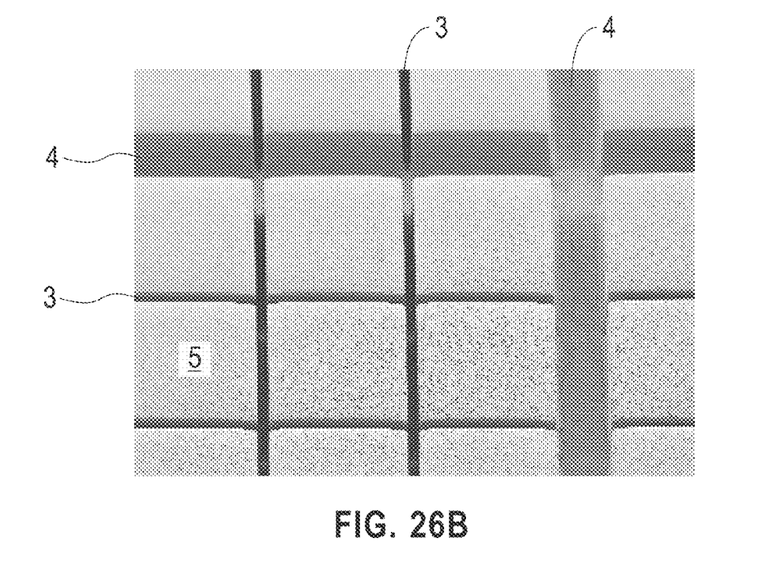

FIG. 26B depicts a top-view of the patterned structure with protrusions 5 and the first and second grooves 4, 3.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

We claim:

1. A method for producing a plate having first and second grooves comprising different widths and different depths,
    said method comprising steps of:
    creating, on a metal plate, a patterned first photoresist having a shape of perpendicularly intersecting straight lines;
    electroplating a first filling layer of metal on the plate between the lines of the first photoresist;
    chemical mechanical polishing the first filling layer of metal to form a flat surface;
    depositing on the flat surface a patterned second photoresist, having first and second structure parts comprising lines of different thicknesses, wherein at least part of the second photoresist is located upon the first photoresist;
    electroplating a second filling layer of metal between the lines of the second photoresist;
    chemical mechanical polishing the second filling layer of metal to create a flat surface; and
    removing the first and second photoresist to expose the first and second grooves between the metal with different depths.

* * * * *